United States Patent
De Jongh et al.

(10) Patent No.: US 7,224,428 B2
(45) Date of Patent: May 29, 2007

(54) LITHOGRAPHIC APPARATUS AND DEVICE MANUFACTURING METHOD

(75) Inventors: Robertus Johannes Marinus De Jongh, Eindhoven (NL); Petrus Marinus Christianus Maria Van Den Biggelaar, Nuenen (NL); Thomas Augustus Mattaar, Veldhoven (NL); Jan Van De Ven, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 287 days.

(21) Appl. No.: 10/894,366

(22) Filed: Jul. 20, 2004

(65) Prior Publication Data

US 2005/0036123 A1  Feb. 17, 2005

(30) Foreign Application Priority Data

Jul. 21, 2003  (EP) .................................. 03077297

(51) Int. Cl.
- *G03B 27/42* (2006.01)
- *G03B 27/58* (2006.01)
- *G06F 19/00* (2006.01)

(52) U.S. Cl. ........................... 355/53; 355/72; 355/75; 700/186

(58) Field of Classification Search .................. 355/67, 355/72, 75, 53; 700/186; 318/649
See application file for complete search history.

(56) References Cited

U.S. PATENT DOCUMENTS

| 3,911,391 | A | 10/1975 | Held et al. |
| 5,229,872 | A | 7/1993 | Mumola |
| 5,296,891 | A | 3/1994 | Vogt et al. |
| 5,523,193 | A | 6/1996 | Nelson |
| 5,969,441 | A | 10/1999 | Loopstra et al. |
| 6,046,792 | A | 4/2000 | Van Der Werf et al. |
| 6,260,282 | B1 | 7/2001 | Yuan et al. |
| 2001/0015901 | A1 | 8/2001 | Motoori |

FOREIGN PATENT DOCUMENTS

| WO | WO 98/33096 | 7/1998 |
| WO | WO 98/38597 | 9/1998 |
| WO | WO 98/40791 | 9/1998 |

*Primary Examiner*—Diane Lee
*Assistant Examiner*—Marissa A. Ohira
(74) *Attorney, Agent, or Firm*—Pillsbury Winthrop Shaw Pittman LLP

(57) ABSTRACT

A lithographic apparatus is presented that includes a controller having a series connection of at least two integrators and an integrator output circuit for deriving an output quantity of the series connection of integrators. The controller also includes an integrator saturator that is operatively coupled to the integrator output circuit and having an operating area for passing through the output quantity and a saturation area for saturating the output quantity. A saturation control mechanism for controlling saturation sets an output quantity of at least one of the series-connected integrators to a neutral value, when the integrator saturator is in the saturation area, except when the output quantity of or an input quantity of at least one of the series-connected integrators has a value such that it would tend to bring the integrator saturator from the saturation area to the operating area.

12 Claims, 7 Drawing Sheets

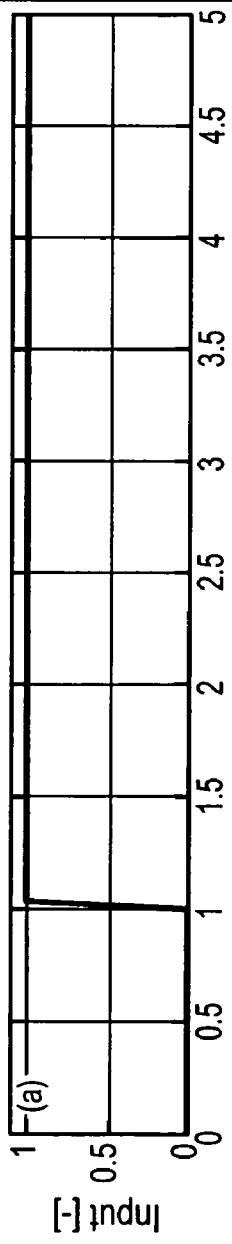
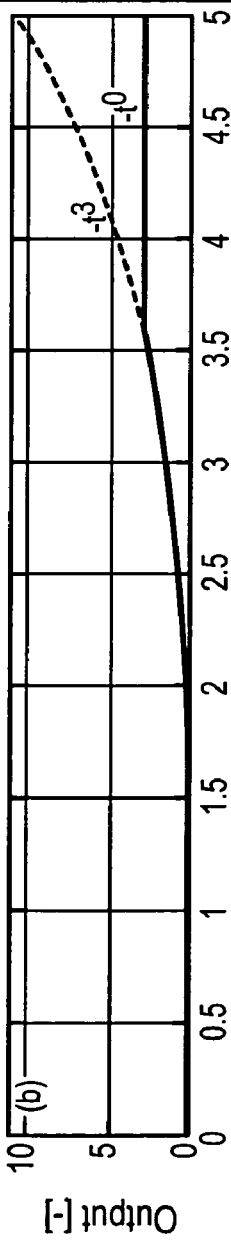
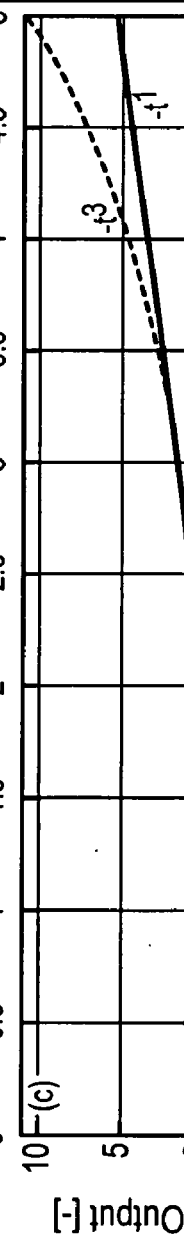
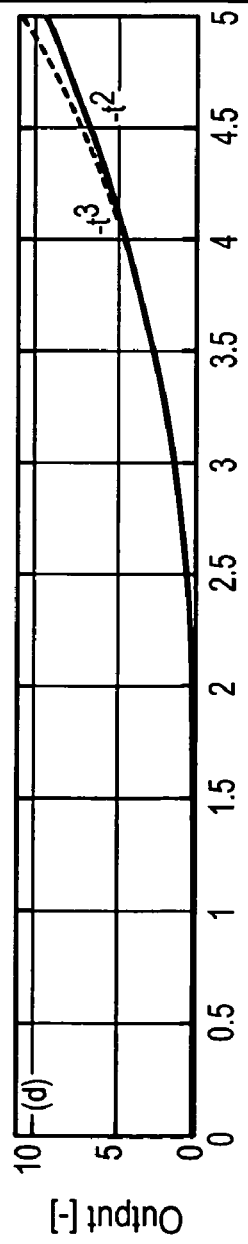
Fig. 6(a)
Fig. 6(b)
Fig. 6(c)
Fig. 6(d)

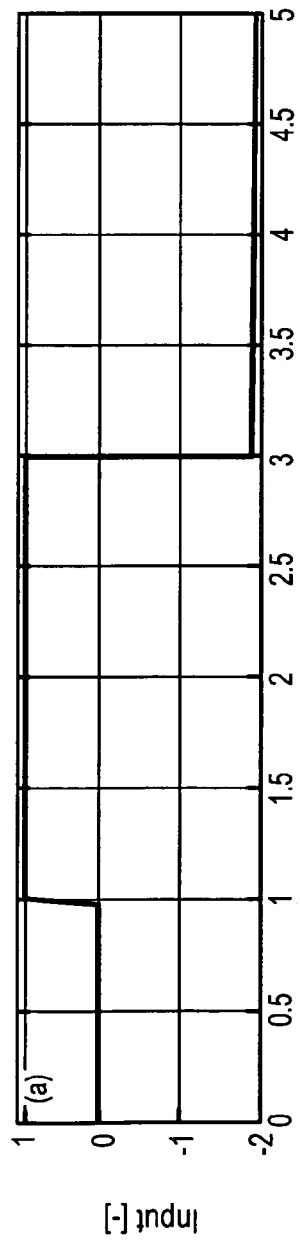
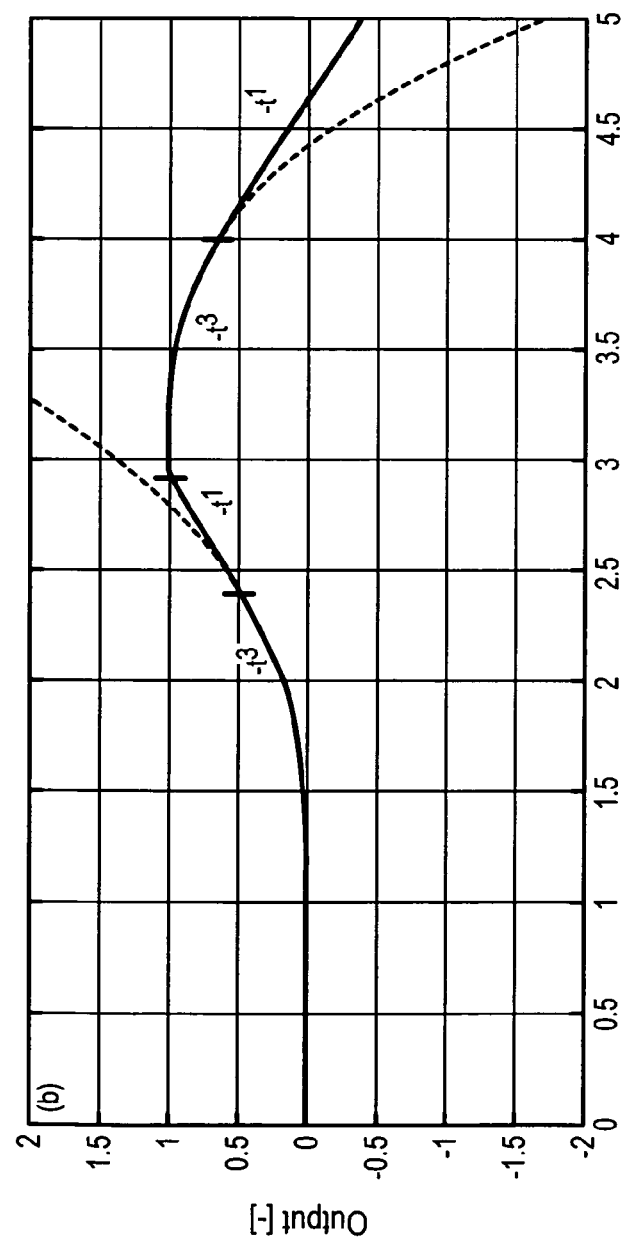

LITHOGRAPHIC APPARATUS AND DEVICE MANUFACTURING METHOD

BACKGROUND OF THE INVENTION

1. Priority Information

This application claims priority from European Patent Application No. 03077297.4, filed Jul. 21, 2003, the contents of which is herein incorporated by reference in its entirety.

2. Field of the Invention

The present invention relates to a lithographic apparatus and a device manufacturing method.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder/holder, which ensures that the mask can be held at a desired position in the incoming radiation beam, and that it can be moved relative to the beam if so desired;
- a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and
- a programmable LCD array: an example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder/holder; however, the general principles discussed in such instances should be seen in the broader context of the patterning device as set forth here above.

In general, a single wafer will contain a whole network of adjacent target portions that are successively irradiated via the projection system, one at a time. In current apparatus, employing patterning by a mask on a mask table/holder/holder, a distinction can be made between two different types of machine. In one type of lithographic projection apparatus, each target portion is irradiated by exposing the entire mask pattern onto the target portion in one go; such an apparatus is commonly referred to as a wafer stepper.

In an alternative apparatus—commonly referred to as a step-and-scan apparatus—each target portion is irradiated by progressively scanning the mask pattern under the projection beam in a given reference direction (the "scanning" direction) while synchronously scanning the substrate table/holder/holder parallel or anti-parallel to this direction. Since, in general, the projection system will have a magnification factor M (generally <1), the speed V at which the substrate table/holder/holder is scanned will be a factor M times that at which the mask table/holder/holder is scanned. More information with regard to lithographic devices as here described can be gleaned, for example, from U.S. Pat. No. 6,046,792, incorporated herein by reference.

In a device manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example, whereby any of these types of projection system may either be suitable for conventional imaging or be suitable for imaging in the presence of an immersion fluid. The radiation system may also include components operating according to any of these design types for directing, shaping, or controlling the projection beam of radiation, and such components may also be referred to below, collectively or singularly, as a "lens". Further, the lithographic apparatus may be of a type having two or more substrate tables/holders (and/or two or more mask tables/holders). In such "multiple stage" machines the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Known lithographic apparatus comprise one or more movable parts. The movable parts can, for example, comprise the substrate table/holder for moving the substrate, or any other part of the apparatus which may or may not be mentioned above, such as, for example, a mirror. For accurate positioning, the position of the movable part is controlled by a controller which, in general, comprises one or more integrators that provide a high gain, and thus a high accuracy at lower frequencies while providing suppression of lower frequencies.

For further suppression of disturbances at low frequencies, two, three, or even more integrators, or alternatively integrators of a second, third or higher order are desirable. With such integrators, a gain and, thus, an amplification at lower frequencies may be increased which reduces low frequency residual errors. Commonly, a saturator (sometimes referred to as a "limiter") might be included to limit the output quantity of the controller to a "safe value" to avoid too high a value of the output quantity of the controller. Such high value of the output quantity could cause a damage, either to actuators actuating the movement of the moving part, or for example to electrical parts which drive the actuators. Further, the saturator could avoid mechanical damage which would occur in case that a part of a mechanical construction would reach a mechanical limiter or other obstruction.

SUMMARY OF THE INVENTION

There are, however, problems associated however with the use of multiple integrators in combination with one or more saturators. For example, a lock-in time is required to bring back the closed loop control system, of which the controller forms a part, into a linear range. Assume, for example, that the controller comprises three series-connected integrators. Further, assume that due to a significant change in for example an input quantity, or due to a significant disturbance, the saturator at the output of the controller has been brought into the saturation area, and further that as a result of this, all three integrators have a value of their respective output quantity which is high (for example also saturated).

As such, the output of the third one of the series-connected integrator can now only get back into the linear region, after the previous (i.e. second) one of the series-connected integrators has an output value having a sign opposite to the starting condition described above. Similarly, the second one of the integrators will only get to such a condition in which the output value has an opposite sign as compared to the initial condition, when the first one of the integrators has an output value with an opposite sign as compared to the initial output value. As each of the integrators will show a maximum "slew-rate" or other dynamic limitation, such changes of the respective outputs of the first and second integrators will take a substantial time depending on the slew-rate or other dynamic limitation.

Thus, only after the first one of the series-connected integrators has changed from its initial, high value into a value having an opposite sign, the second one of the integrators can start to react on this change, and only at the moment when the second one of the integrators has reached an output value having an opposite sign as compared to the initial output value of this integrator, the third one of the integrators can react on this change. Consequently, the time required for the control loop to get back into the linear region again, can be relatively long.

For at least these reasons, principles of the present invention, as embodied and broadly described herein, provide a lithographic apparatus which reduces the time for a control loop to reach the linear region. In one embodiment, the lithographic apparatus comprises a substrate holder configured to hold a substrate; a radiation system configured to condition a beam of radiation; a support structure configured to support a patterning device that imparts a desired pattern onto the beam of radiation, the support structure including a stage; a projection system that projects the patterned beam onto a target portion of the substrate; and a controller configured to control a quantity representing an attribute of a movable part of the apparatus. The controller comprises at least two integrators connected in series; an integrator output circuit configured to derive an output quantity of the series-connected integrators from a respective output quantity of at least one of the integrators of the series-connected integrators; an integrator saturator operatively coupled to the integrator output circuit, the integrator saturator having an operating region in which the output quantity is passes through and a saturation area in which the output quantity is limited; and a saturation control mechanism configured to set the output quantity of at least one of the series-connected integrators to a neutral value when the integrator saturator is in the saturation area, except when an input quantity or the output quantity of at least one of the series-connected integrators has a value that is capable of bringing the integrator saturator from the saturation region to the operating region.

Thus, at a moment when saturation takes place, the saturation control mechanism will set an output quantity of at least one of the series-connected integrators to a neutral value, when the output quantity of the saturator is in the saturation area. As a consequence, it is not required anymore for one or more of the series-connected integrators that the output quantity gradually changes (such as slews) from the initial, high value to the neutral value, and thus the delay time for the respective integrator of the series connection of integrators is reduced. Preferably, the saturation control mechanism is able to set an output quantity of several of the series-connected integrators, or all of the series-connected integrators except for the last one, thus being able to eliminate the delay time of each of the integrators of the series connection of integrators, which is under control of the saturation control mechanism. As soon as the output quantity of the at least one of the series-connected integrators which is influenced by the saturation control mechanism has a value which would tend to bring the output quantity of the output circuit towards the operating area, the saturation control mechanism will not any more set an output quantity of the respective one of the series-connected integrators to the neutral value, as this value of the output quantity will initiate the transition of the controller from the saturated area towards the closed loop (i.e. mostly linear) area.

The term integrator is to be interpreted as comprising theoretical, mathematical integrators having e.g. infinite gain at zero frequency as well as practical approximations thereof having a (mostly physically or practically limited) frequency band in which a mathematical of theoretical integrator is approximated. Also, the integrator can be numerical, such as digital, or analogue. The output quantity of the integrator can be any suitable quantity, such as a voltage or current or can be a numerical quantity, for example in the case of a digital integrator. Also, the saturator can be implemented in any suitable technology, the saturator can for example be analogue and implemented by means of the dedicated circuitry, however it is also possible that the saturator is a numerical, such as a digital saturator, e.g. implemented by means of suitable software instructions e.g. running on a suitable data processing device. In general, where in this document the wording in series, connected to or any other term which might refer to an implementation in hardware is applied, these terms are to be understood as also including any other implementation, such as a numerical implementation in which a connection, series connection or other might be implemented in a numerical or other suitable way. Similarly, the terms input, output etc should be understood as including physical quantities, such as analogue voltages or currents, but can also include any kind of numerical quantity. The term "a neutral value" is to be interpreted as a value of the output quantity of one of the series-connected integrators which tends to bring a following one of the series-connected integrators into or close to a linear area, i.e. a non-saturating area. A following integrator of the series-connected integrators is to be interpreted as an integrator of which an input is connected to an output of a previous one of the series-connected integrators.

The physical quantity can comprise any physical quantity, such as a pressure, a temperature, a flow, a dosage. Preferably, the physical quantity comprises a positioning quantity of a movable part of the apparatus, such as an acceleration, a speed, a force or any other mechanical quantity related to the movable part of the apparatus. Also, the physical quantity can comprise any combination of such quantities. Preferably, the controller comprises a position controller for controlling a positioning quantity such as, a position, a velocity of, an acceleration of or a force acting on the movable part of the apparatus.

The controller, and in particular the output quantity thereof, immediately acts on the physical quantity, e.g. by means of an actuator, a converter, an amplifier, a summing circuit for adding one or more other signals or quantities, etc.

Advantageously, the controller further comprises bridging mechanism for bridging at least one of the series-connected integrators under control of a bridging control means for bridging the at least one of the series-connected integrators based on a predetermined criterion. By bridging one or more of the integrators of the series connection of integrators, the controller changes its behavior. Assume for example that the series connection of integrators comprises three series-connected integrators. By bridging two of these series-connected integrators, a controller having a single integrator results. Thus, under certain, predetermined circumstances (depending on the predetermined criterion), the properties of the controller can be altered, to adapt the controller for controlling the (value of) the physical quantity under specific situations as determined by the predetermined criterion. The bridging can comprise a bridging in hardware such as an electrical bridging of the integrator, a numerical bridging (such as in software) or any other means for (when the bridging is activated), creating a situation in which the output quantity of the respective, bridged integrator, or the input quantity of a following integrator, is substantially equal to or proportional to an input quantity of the bridged integrator.

The predetermined criterion can comprise at least one of a group comprising a startup of the control system, an instability of the control system, an overload condition, and an error condition. By bridging one or more of the integrators, the behavior of the controller can be altered in use, and with a suitable implementation (such as for example a numerical, digital implementation), it is possible to implement the bridging in such a way that at a moment of a change, such as an activation of a bridging or a deactivation of a bridging no changes at the output are observed, thus leading to a smooth transition (also referred to as bumpless transfer or bumpless parameter change), avoiding any steps, sparks or other transients which could lead to an error or temporary error in the value of the physical quantity.

Advantageously, at least one of the series-connected integrators comprises a series connection of an amplification stage and an integrator stage, an input of the integrator stage being connected to an output of the amplification stage, an amplification of the amplification stage being under control of a parameter change mechanism. Thus, when a parameter (such as the amplification) of the amplification stage is altered, sudden changes at the output of that integrator can be avoided, as only the output of the amplification stage and not the output of the integrator stage alters. Thus, sudden, such as stepwise, changes of the output quantity of the integrator are avoided, leading to a smooth, bumpless transition, i.e. it can thus be avoided that a change in a parameter leads to a sudden, undesired change in the value of the physical quantity.

Advantageously, the controller functionally comprises a first branch comprising the series-connected integrators and a second branch, parallel to the first branch, the second branch comprising at least one of a proportional, a low pass (roll off) filtering, and a differential transfer function. The controller can also comprise further, preferably parallel branches.

Thus, advantageously, the integrators of the controller are comprised in a first branch, while other parts, such as a proportional or a differential (differentiator) transfer function are comprised in a second branch. The second branch is functionally parallel to the first branch, i.e. a same signal is applied to the inputs of both branches while the respective output signals of each of the branches are combined in a suitable manner, such as by means of addition. An advantage of the fact that the series-connected integrators are comprised in a separate branch of the controller is that it is now made possible to implement the saturator in the first branch, thus limiting the saturation action to the series-connected integrators. Alternatively, it is of course also possible that the saturator of the series-connected integrators is functionally located "after" the conjunction of the branches, i.e. thus saturating the combination of the output signals of the respective branches. The combination of the outputs of the branches can be in any suitable manner, however in an advantageous embodiment the output circuit comprises an adding unit for adding the respective output quantities in a weighted or un-weighted manner, leading to a practical implementation. In addition to, or instead of the controller saturator as described above, the controller can further comprise a second branch saturator for saturating an output quantity of the second branch and a controller output saturator for saturating an output quantity of the controller. In fact, in case of multiple branches, each branch can be provided with its own saturator for saturating an output quantity of the respective branch. In this manner, accuracy can be increased and a range of an output signal of the controller can be accurately limited, as each of the branches is equipped with its own respective saturator, while the output of the controller (i.e. comprising the respective output signals of each of the branches) also comprises a saturator. Also, in case of a change of parameters in operation (such as for example by bridging one or more of the integrators as described above, or any other change of any parameter in the controller), the occurrence of transients or steps or other sudden changes which could result in undesired sudden changes of the value of the physical quantity, can be largely eliminated.

Advantageously, the physical quantity comprises a positioning quantity of a movable part of the apparatus, the movable part advantageously comprising a gravity compensated mirror assembly. The positioning quantity can comprise any kind of quantity related to a position of the movable part, such as a position, a velocity, an acceleration, a force, etc. The gravity compensation can be in any suitable manner, such as a pneumatic compensation, an electromagnetic compensation, etc. The controller, which controls the position of the movable part by means of one or more suitable actuators, thus does not need to act a force on the movable part for overcoming gravity, as gravity already is at least partly compensated by the gravity compensation.

At least part of the controller can be implemented in a form of suitable software instructions executable on an electronic data processing device.

The same or similar effects are achieved in another embodiment providing a method, comprising providing at least two integrators connected in series; deriving an output quantity of the series-connected integrators from a respective output quantity of at least one of the integrators of the series-connected integrators; passing through the output quantity when the output quantity does not exceed a predetermined value; limiting the output quantity when the output quantity exceeds the predetermined value; and controlling saturation by setting an output quantity of at least one of the series-connected integrators to a neutral value when the output quantity of the series connection of integrators exceeds the predetermined value, except when an input quantity or the output quantity of at least one of the series-connected integrators has a value that is capable of bringing the output quantity of the series-connected integrators below the predetermined value.

A controller according to the invention also achieves the same or similar effects in that the controller comprises at least two integrators connected in series; an integrator output circuit that derives an output quantity of the series connection of integrators from a respective output quantity of at least one of the integrators of the series connection of integrators, an integrator saturator, operatively coupled to the integrator output circuit, the integrator saturator having an operating region for passing through the output quantity and a saturation region for limiting the output quantity; and a saturation control mechanism configured to set the output quantity of at least one of the series-connected integrators to a neutral value when the integrator saturator is in the saturation area, except when an input quantity or the output quantity of at least one of the series-connected integrators has a value that is capable of bringing the integrator saturator from the saturation region to the operating region.

It will be appreciated by the skilled person that the same or similar embodiments as described with reference to the apparatus according to the invention can also be utilized with the method and the controller according to the invention.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle", "wafer", or "die" in this text should be considered as being replaced by the more general terms "mask", "substrate", or "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as for example ion beams or electron beams.

BRIEF DESCRIPTION OF DRAWINGS

Embodiments of the invention will now be described, by way of example only, with reference to the accompanying schematic drawings in which corresponding reference symbols indicate corresponding parts, and in which:

FIGS. 6(a), 6(b), 6(c), 6(d) depict control signals generated by a controller according to the invention; and FIGS. 7(a), 7(b) depict control signals generated by a controller according to the invention.

DETAILED DESCRIPTION OF THE INVENTION

Figure 1:
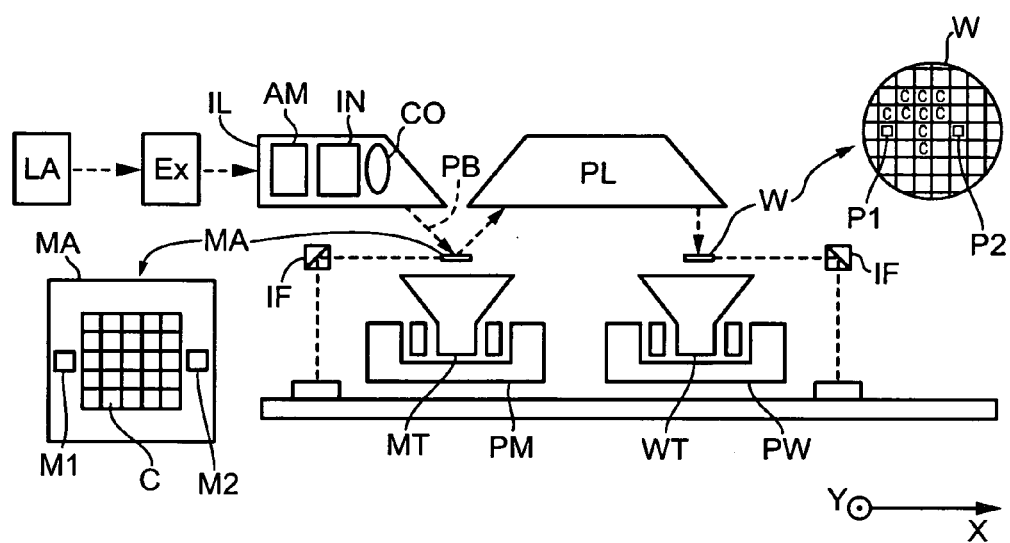
FIG. 1 depicts a lithographic apparatus according to an embodiment of the invention.

FIG. 1 schematically depicts a lithographic projection apparatus 1 according to a particular embodiment of the invention. The apparatus comprises:
 a radiation system Ex, IL: for supplying a projection beam PB of radiation (e.g. EUV, DUV, or UV radiation). In this particular case, the radiation system also comprises a radiation source LA;

a first object table (mask table/holder/holder) MT: provided with a mask holder for holding a mask MA (e.g. a reticle), and connected to first positioning mechanism for accurately positioning the mask with respect to item PL;

a second object table (substrate table/holder) WT: provided with a substrate holder for holding a substrate W (e.g. a resist-coated silicon wafer), and connected to second positioning mechanism for accurately positioning the substrate with respect to item PL;

a projection system ("lens") PL: for example, a mirror or refractive lens system that images an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA produces a beam of radiation. This beam is fed into an illumination system (illuminator) IL, either directly or after having traversed conditioning means, such as for example a beam expander Ex. The illuminator IL may comprise adjusting means AM for adjusting the angular intensity distribution in the beam. Generally, at least the outer and/or inner radial extent (commonly referred to as σ-outer and σ-inner, respectively) of the intensity distribution in a pupil plane of the radiation system can be adjusted. In addition, the illuminator IL will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently impinges on the mask MA, which is held on a mask table MT. Reflected from the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:
step mode: the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;

scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
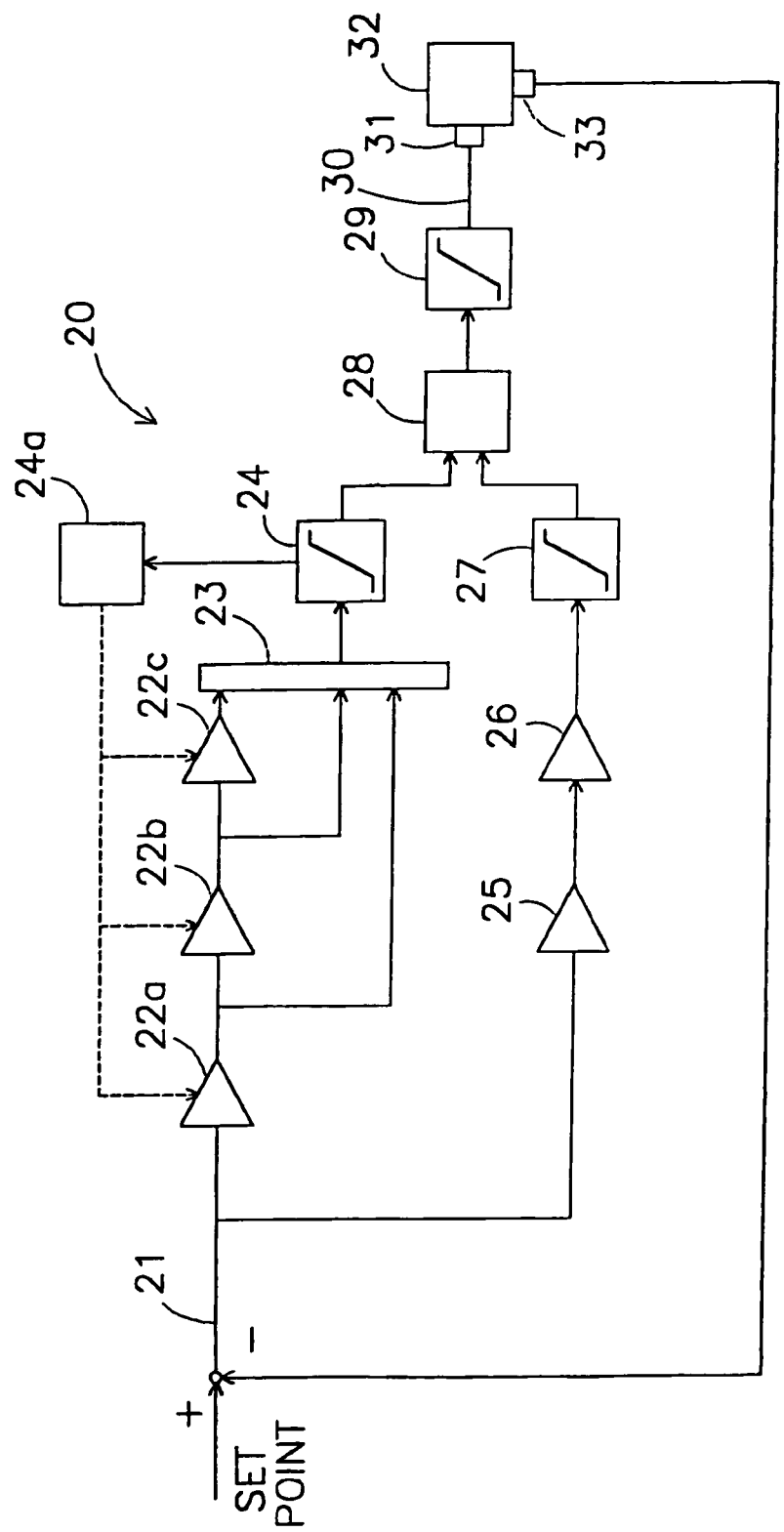
FIG. 2 depicts a controller for the lithographic apparatus according to FIG. 1.

FIG. 2 depicts a controller 20, which forms part of the apparatus according to FIG. 1. The controller 20, in this example, controls a position of a movable part of the apparatus, the controller forming part of a closed loop control loop for controlling the position of the movable part. Thereto, an output 30 of the controller in operation drives an actuator 31 which in turn (at least partly) influences a position of a movable part 32. Position information of the movable part, such as a position, an acceleration, a velocity, etc., is detected by a position detection mechanism 33 which can comprise any suitable detection mechanism known as such. As depicted in FIG. 2. the output of position detection mechanism 33 is fed back to an input 21 of the controller 20, where it may be subtracted from a Set Point value.

The movable part can comprise any movable part of the apparatus according to FIG. 1, examples of said movable part are the substrate table, a part of the projection system or the radiation system, support structure etc., or any other part not shown or not described with reference to FIG. 1, such as a mirror, etc.

To achieve a desired accuracy and dynamic response of the closed loop control system depicted in FIG. 2, the controller comprises integrative, proportional, as well as differential gain as will be described in more detail below. In this embodiment, the controller 20 comprises three integrators 22a, 22b and 22c which are connected in series, i.e. an output of one of the integrators (such as integrator 22a) is connected to an input of a following one of the integrators (in this example 22b). Thus, a third order integration is provided by the series connecting of integrators 22a, 22b and 22c. Outputs of each of the integrators 22a, 22b and 22c are connected to an integrator output circuit 23.

The integrator output circuit 23 derives an output quantity from the various quantities supplied to it. The output of the first of the series-connected integrators 22a provides for an integrating component, the output of the second of the series-connected integrators 22b of integrators provides for a second order integration component, while the output of the third of the series-connected integrators 22c of the integrators provides for a third order integration component.

The integrator output circuit 23 combines one or more of these components in a weighted or unweighted manner into an output signal which is provided to a controller saturator 24. The controller saturator 24 has an operating region in which an output quantity of the integrator output circuit is passed through, and a saturation region in which the output quantity of the integrator output circuit 23 is limited. Thus, for example, excessive values or values which are outside a safe operating region can be limited by the saturator, preventing undesired effects.

The controller 20 further comprises a second branch, which consists of the proportional amplification 25, the differential amplification 26, and a second branch saturator 27. The second branch is provided with a same input signal 21 as the first branch comprising the series-connected integrators 22a, 22b, 22c, the integrator output circuit 23, and the saturator 24. The proportional amplification 25 and the differential amplification 26 provide for a proportional and differential gain, while the saturator 27 limits an output value of the second branch. Also, a low pass filter (not shown) could be included in the second branch, preferably before the saturator 27.

In the second branch, the proportional amplification and the differential amplification can also functionally be positioned in parallel, thus in fact providing for a second and a third branch. Further, it is of course possible that the saturator 27 is left out, or alternatively that the saturator 27 is located to saturate an output quantity of the proportional amplification only.

Output values of the first and second branches are combined in the adding unit 28 for adding the respective output quantities of the branches. The adding can take place in a weighted or an unweighted manner.

The controller 20 further comprises an output saturator 29 which limits the output quantity of the adding unit 28. The output quantity of the output saturator 29 is provided to the actuator 31 which in turn influences a position of the movable part 32. In general, the saturator 29 can act on a quantity which represents an actuator force, or on a quantity which represents a control force. In the single axial, single dimensional example shown in FIG. 2, these forces are identical, but these forces might be different in a multi-axial, multi-dimensional setup. In such more complex setup, it is also possible that the saturator 29 comprises a controller force saturator for saturating the quantity representing the controller force and/or an actuator force saturator for saturating a quantity representing the actuator force.

Depending on circumstances, a value of the input signal 21 during a certain time period can cause one or more of the series-connected integrators 22a, 22b, 22c to which a high output value causing the output value of the integrator output circuit to reach a value such that the saturator 24 saturates. Then, according the invention, a saturation control mechanism 24a sets an output quantity of at least one of the series-connected integrators (in this example at least the output of the first one, 22a, of the series-connected integrators) to a neutral value. It is however also possible for a further decrease of response time, that the outputs of the first and the second integrator, or in general the outputs of all integrators preferable except the output of the last integrator, are set to the neutral value. The neutral value will prevent still further integration of the integrators 22b and 22c, and thus a still higher output quantity of these integrators.

At a moment when the value of the input quantity of the controller 21 changes such that the output quantity of the first one of the series-connected integrators 22a would obtain a value which would tend to bring the output quantity of the series connection of integrators from the saturation area into the operation area. Then the saturation control mechanism 24a does not set the output quantity of the first one, 22a, of the series connection of integrators to the neutral value anymore. This can also be the case when the value of the input quantity 21 of the controller 20 has a value such that it would tend to bring the output quantity of the series connection of integrators from the saturation area to the operating area.

In these situations, the output quantity of the at least one of the series-connected integrators is not set to the neutral value anymore, but is "released" to obtain a value corresponding to the momentary or time dependent value of the respective input quantity of the respective integrator of the series connection of integrators, and thus it will tend to bring the output quantity of the series connection of integrators towards the operating area. As a consequence, delay time, i.e. the time required from a moment when a change in that value of the input quantity 21 of the controller 20 occurs, or a change in its behavior over time occurs, until the moment when the output of the saturator 24, due to this change, gets from the saturation area into the operating area. As each of the branches is equipped by its own saturator 24, 27, and the output of the controller is also equipped with a respective saturator 29, excessive, undesired values of the output quantities in each of the branches, as well as of the output quantity of the controller are prevented.

The integrators of the series-connected integrators 22a, 22b, 22c can also be provided with bridging mechanism (not shown) for bridging at least one of these integrators. By bridging one or more of the integrators, the integrative action of these integrators is taken out of the transfer function of the controller. Thus, in the example of FIG. 2 where a third order integrator comprising 3 series-connected integrators, is depicted, bridging one or two of the integrators will effectively result in a second or first order integrator, respectively. The bridging mechanism are controlled by bridging control means for bridging the respective integrator based on a predetermined criterion, such as a start-up of the control system, an instability, an overload condition, an error condition, etc. Due to the three saturators 24, 27 and 29 it is prevented, in a digital, numeric implementation, that the output of the controller 20 exceeds the saturation under all circumstances. Thus, by the use of a saturator 24, 27 for each branch as well as a saturator for the output of the controller 20, even temporary values exceeding the saturation level can be prevented.

It will be appreciated that in some discrete implementations, such as where evaluation of the output value of the output circuit 23 is performed more than one time in one sample, it might be advantageous to integrate the function of the controller saturator 24 and saturation control mechanism 24a into one combined block such that the outputs of the integrators 22a, 22b, 22c are set such that the output value of the integrator output circuit 23 results in a saturated value.

Further, at least one of the series-connected integrators can comprise a series connection of an amplification stage and an integrator stage (not shown in detail in FIG. 2) which are connected is series such that an input of the integrator stage is connected to an output of the amplification stage, an amplification of the amplification stage being under control of a parameter change mechanism. Thus, a bumpless transfer can be achieved as in the case of a change of an amplification parameter, no sudden change (such as stepwise) at the output of the respective integrator will occur due to the integrative action of the integrator stage positioned after the amplification stage, thus avoiding stepwise changes in the output signal 30, and this sudden, undesired movements or accelerations of the movable part.

Hereinbefore a description was given of an integrator saturator coupled to the integrator output circuit (block 24 in FIG. 2) and a saturation control mechanism for controlling saturation (block 24a in FIG. 2). The variation described hereinafter is that it is possible to saturate not only the output of the complete integrator branch of the controller, but it is also possible to saturate each integrator. FIGS. 6(a), 6(b), 6(c), 6(d) show the behavior of three integrators.

Figure 3:
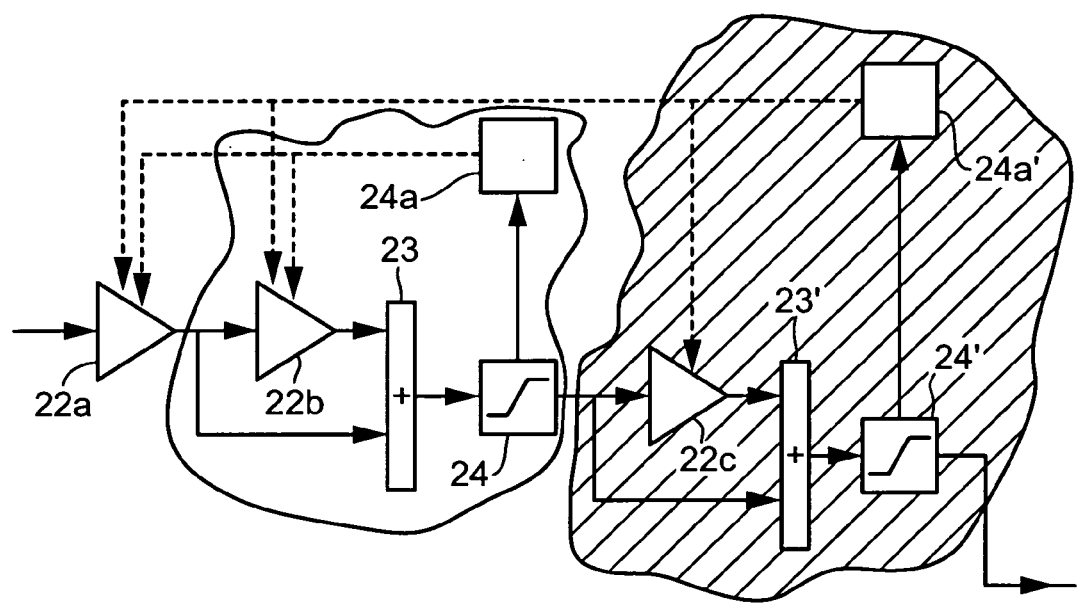
FIG. 3 depicts a controller for the lithographic apparatus according to FIG. 1.

FIG. 3 shows an implementation having extra saturators achieved by adding an extra saturator and saturator control mechanism. In FIG. 3, the integrator branch is plotted with two integrators (22a, 22b), a third integrator (22c) including integrator output circuit (23') saturator (24') and saturator control mechanism (24a'). The parts are enclosed by the gray area. This gray area is a copy of the function blocks encircled by the dashed line and can be repeated several times for a $3^{rd}$, $4^{th}$, $5^{th}$ etc, integrator. It is also possible to have a saturator between 22a and 22b including its own saturation control mechanism. For this situation, integrator 22a becomes a single anti-windup integrator.

The saturation control algorithm 24a' can overrule saturation control algorithm 24a. If more additional integrators and saturation control algorithm are added, the priority of the saturation control mechanisms depends on the number of integrators that are limited by the saturator. So, if plotted like figure saturation control mechanism at the right hand side overrule saturation control mechanisms at the left side of it.

If the output of the integrator output circuit 23 exceeds the limits as defined by the saturator 24, integrator 22a will be made equal to 0 and integrator 22b will be equal to the limit of the saturator, including the sign of the integrator output 22b. If integrator output circuit 23' exceeds the limits defined by saturator 24', the saturation controller mechanism 24a' will set the integrator 22c equal to the limit of the saturator and the sign of the integrator. Integrators 22b and 22a will be set to 0. This is independent on what saturator control mechanism 24 has for effects on the integrators.

Figure 4:
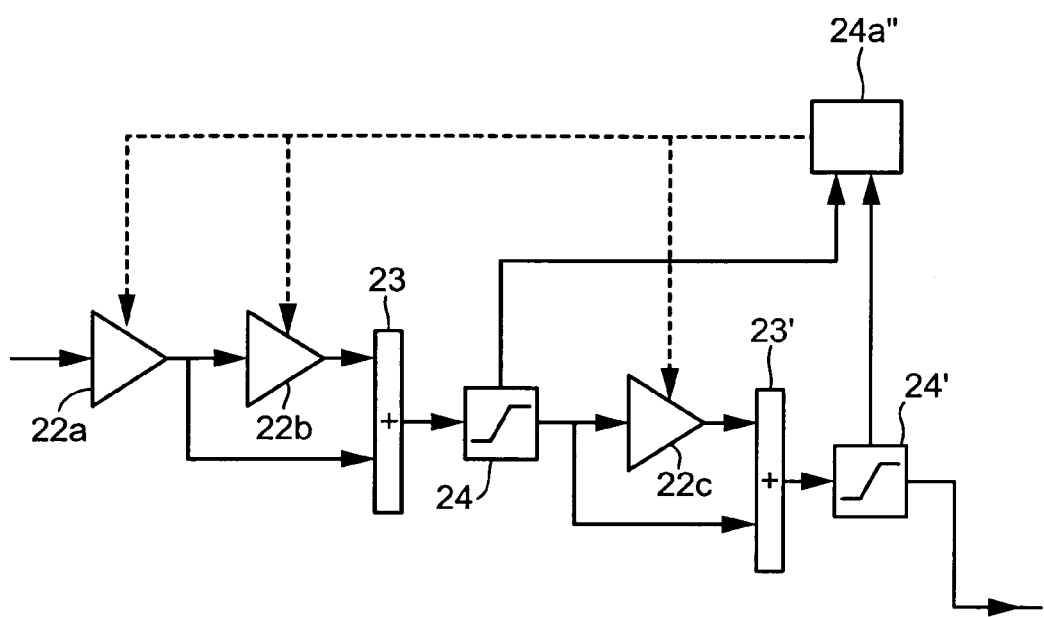
FIG. 4 depicts a controller for the lithographic apparatus according to FIG. 1.

In fact, saturation control mechanisms 24a and 24a' can be combined into one 24a'' as depicted in FIG. 4. Also here, the number of integrators can be extended.

Figure 5:
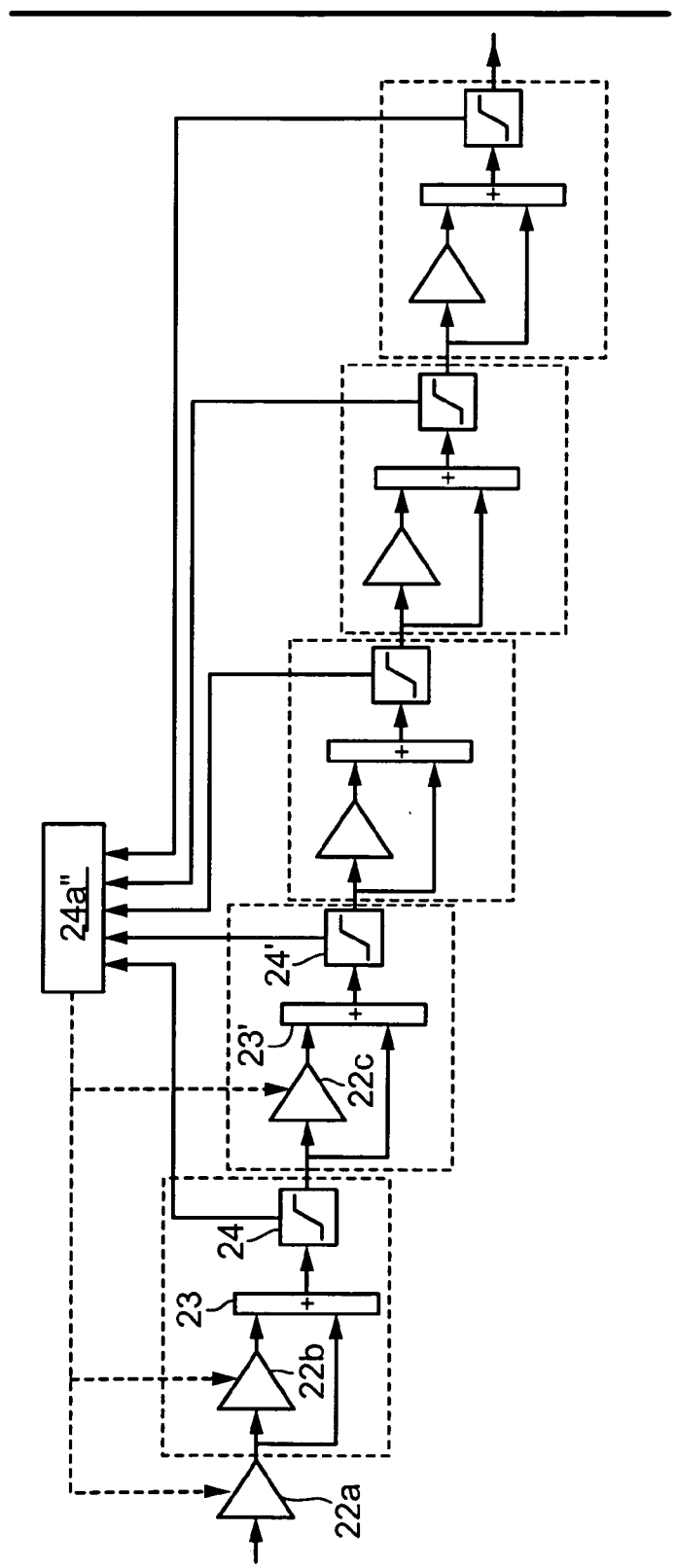
FIG. 5 depicts a controller for the lithographic apparatus according to FIG. 1.

FIG. 5 shows an implementation with a cascade of 5 integrator units. This makes in total an integrator branch with 6 integrators.

FIG. 6(a) shows an step-form input signal. FIG. 6(b) shows the output of a series of 3 integrators. At t=3.6 sec the saturator of the third integrator clips. This results in an output signal that is equal to the saturator limit. FIG. 6(c) plots the output signal with a saturator active on the second integrator. Near t=3 sec the second saturator clips. The input of the second integrator is from that moment on, a constant value. The output of the third integrator is equivalent with $t^1$.

FIG. 6(d) shows the output of the third integrator while a saturator limits the output of the first integrator. The input of the second integrator is a constant value. This makes that the output of the third integrator is equivalent with $t^2$.

It is possible to combine multiple saturators in the integrator branch. This is depicted in FIG. 7. FIG. 7(a) shows an input signal for a series of three integrators. The second and last integrators each have a saturator. In plot 7(b) it is clear to see that at t=1 sec, the output of the third integrator increases with $t^3$. At t=2.4 sec, the second saturator limits the output of the second integrator. From that moment on, the output of the third integrator equals t. At t=2.92 sec, also the third integrator saturates. The output is limited to 1. At t=3 sec. the output of the third integrator not longer saturates because the sign of the input is changed. After a while, at t=4 sec, the second integrator saturates again, so the output of the third integrator decreases with $t^1$.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
a substrate holder configured to hold a substrate;
an illuminator configured to condition a beam of radiation;
a support structure configured to support a patterning device that imparts a desired pattern onto the beam of radiation, the support structure including a stage;
a projection system that projects the patterned beam to a target portion of the substrate; and
a controller configured to control a quantity representing an attribute of a movable part of the apparatus, the controller comprising:
at least two integrators connected in series;
an integrator output circuit configured to derive an output quantity of the series-connected integrators from a respective output quantity of at least one of the integrators of the series-connected integrators;
an integrator saturator operatively coupled to the integrator output circuit, the integrator saturator having an operating area in which the output quantity is passed through and a saturation area in which the output quantity is limited; and
a saturation controller configured to set the output quantity of at least one of the series-connected integrators to a neutral value when the integrator saturator is in the saturation area, except when an input quantity or the output quantity of at least one of the series-connected integrators has a value that is capable of bringing the integrator saturator from the saturation region to the operating area.

2. The lithographic apparatus of claim 1, wherein the controller further comprises a bridging mechanism that bridges at least one of the series-connected integrators under control of a bridging control mechanism configured to bridge the at least one of the series-connected integrators based on a predetermined criterion.

3. The lithographic apparatus of claim 2, wherein the predetermined criterion comprises at least one of a group comprising a startup of the control system, an instability of the control system, an overload condition, and an error condition.

4. The lithographic apparatus of claim 1, wherein at least one of the series-connected integrators comprises a series connection of an amplification stage and an integrator stage, wherein an input of the integrator stage is connected to an output of the amplification stage and an amplification value of the amplification stage being under control of a parameter change mechanism.

5. The lithographic apparatus of claim 1, wherein the controller comprises a first branch comprising the series-connected integrators and a second branch, parallel to the first branch, that includes a proportional transfer function, a low pass filtering transfer function, and/or a differential transfer function.

6. The lithographic apparatus of claim 5, wherein the output circuit comprises an adding unit for adding the respective output quantities.

7. The lithographic apparatus of claim 6, wherein the controller further comprises a second branch saturator that limits an output quantity of the second branch and a controller output saturator that limits an output quantity of the controller.

8. The lithographic apparatus of claim 1, wherein the quantity comprises a position quantity, a velocity quantity, an acceleration quantity, pressure quantity, a temperature quantity, a flow quantity, a dosage quantity and/or a force quantity.

9. A method of controlling a quantity representing an attribute of a moving element, comprising:
deriving an output quantity of at least two series-connected integrators from a respective output quantity of at least one of the integrators;
passing through the output quantity when the output quantity does not exceed a predetermined value;
limiting the output quantity when the output quantity exceeds the predetermined value; and
controlling saturation by setting an output quantity of at least one of the series-connected integrators to a neutral value when the output quantity of the series connection of integrators exceeds the predetermined value, except when an input quantity or the output quantity of at least one of the series-connected integrators has a value that is capable of bringing the output quantity of the series-connected integrators below the predetermined value.

10. A device manufacturing method, comprising:
providing a substrate that is at least partially covered by a layer of radiation-sensitive material;
conditioning a beam of radiation;
endowing the conditioned beam of radiation with a desired pattern in its cross-section;
projecting the patterned beam of radiation onto a target portion of the substrate; and
controlling a quantity representing an attribute of a movable part, wherein the controlling comprises:
deriving an output quantity of at least two series-connected integrators from a respective output quantity of at least one of the integrators;
passing through the output quantity when the output quantity does not exceed a predetermined value;
limiting the output quantity when the output quantity exceeds the predetermined value; and
controlling saturation by setting an output quantity of at least one of the series-connected integrators to a neutral value when the output quantity of the series connection of integrators exceeds the predetermined value, except when an input quantity or the output quantity of at least one of the series-connected integrators has a value that is capable of bringing the output quantity of the series-connected integrators below the predetermined value.

11. A controller for controlling a quantity representing an attribute of a moving element, the controller comprising:
at least two integrators connected in series;
an integrator output circuit that derives an output quantity of the series connection of integrators from a respective output quantity of at least one of the integrators of the series connection of integrators;
an integrator saturator, operatively coupled to the integrator output circuit, the integrator saturator having an operating region for passing through the output quantity and a saturation region for limiting the output quantity; and
a saturation control mechanism configured to set the output quantity of at least one of the series-connected integrators to a neutral value when the integrator saturator is in the saturation area, except when an input quantity or the output quantity of at least one of the series-connected integrators has a value that is capable of bringing the integrator saturator from the saturation region to the operating region.

12. A computer-readable storage medium storing a set of instructions which, when executed, performs the control of a quantity representing an attribute of a moving element by:
deriving an output quantity of at least two integrators connected in series from at least one of the integrators;
passing through the output quantity when the output quantity does not exceed a predetermined value;
limiting the output quantity when the output quantity exceeds the predetermined value; and controlling saturation by setting an output quantity of at least one of the series-connected integrators to a neutral value when the output quantity of the series connection of integrators exceeds the predetermined value, except when an input quantity or the output quantity of at least one of the series-connected integrators has a value that is capable of bringing the output quantity of the series-connected integrators below the predetermined value.

* * * * *